United States Patent
Watanabe

(10) Patent No.: US 9,539,645 B2
(45) Date of Patent: Jan. 10, 2017

(54) CUTTING TOOL

(75) Inventor: Takashi Watanabe, Satsumasendai (JP)

(73) Assignee: Kyocera Corporation, Kyoto-shi, Kyoto (JP)

( * ) Notice: Subject to any disclaimer, the term of this patent is extended or adjusted under 35 U.S.C. 154(b) by 465 days.

(21) Appl. No.: 14/113,727

(22) PCT Filed: Mar. 30, 2012

(86) PCT No.: PCT/JP2012/058572
§ 371 (c)(1),
(2), (4) Date: Oct. 24, 2013

(87) PCT Pub. No.: WO2012/147450
PCT Pub. Date: Nov. 1, 2012

(65) Prior Publication Data
US 2014/0057090 A1   Feb. 27, 2014

(30) Foreign Application Priority Data

Apr. 28, 2011   (JP) ................... 2011-101134

(51) Int. Cl.
*B23B 27/14*    (2006.01)
*C04B 35/587*   (2006.01)
(Continued)

(52) U.S. Cl.
CPC ............ *B23B 27/14* (2013.01); *C04B 35/587* (2013.01); *C04B 35/62695* (2013.01);
(Continued)

(58) Field of Classification Search
CPC ............ B23B 27/14; C04B 35/62695; C04B 35/6455; C04B 35/587; C04B 35/584; C04B 41/009; C04B 41/52; C04B 41/89
(Continued)

(56) References Cited

U.S. PATENT DOCUMENTS 4,984,940 A * 1/1991 Bryant ............... B23B 27/145
                                                     407/119
2003/0108752 A1* 6/2003 Konig ............... C23C 16/45523
                                                     428/469
(Continued)

FOREIGN PATENT DOCUMENTS

JP       10-15707       1/1998
JP       2003-213455    7/2003

OTHER PUBLICATIONS

Kashani et al. "Microstructure and physical properties of titanium nitride coatings produced by CVD process". Materials Science and Engineering A, 286, (2000); pp. 324-330.*

(Continued)

*Primary Examiner* — Prashant J Khatri

(57) ABSTRACT

A cutting tool including a substrate composed of a silicon nitride-based sintered body and a coating layer. The coating layer includes first, second, third and fourth layers. The first layer is located on the surface of the substrate and is composed of TiN having an average crystalline width of 0.1 to 0.4 μm. The second layer is located on the first layer and composed of $Al_2O_3$ having an average crystalline width of 0.01 to 1.5 μm. The third layer is located on the second layer and is composed of TiN having an average crystalline width of 0.01 to 0.1 μm which is smaller than that of the first layer. The fourth layer is located on the third layer and is composed of $Al_2O_3$ having an average crystalline width of 0.01 to 1.5 μm.

8 Claims, 1 Drawing Sheet

(51) Int. Cl.
*C04B 35/626* (2006.01)
*C04B 35/645* (2006.01)
*C04B 41/52* (2006.01)
*C04B 41/89* (2006.01)
*C04B 41/00* (2006.01)
*C23C 16/34* (2006.01)
*C23C 16/40* (2006.01)
*C23C 28/04* (2006.01)
*C23C 28/00* (2006.01)
*C23C 16/32* (2006.01)
*C23C 16/36* (2006.01)
*C04B 111/00* (2006.01)

(52) U.S. Cl.
CPC ........ *C04B 35/6455* (2013.01); *C04B 41/009* (2013.01); *C04B 41/52* (2013.01); *C04B 41/89* (2013.01); *C23C 16/32* (2013.01); *C23C 16/34* (2013.01); *C23C 16/36* (2013.01); *C23C 16/403* (2013.01); *C23C 28/042* (2013.01); *C23C 28/044* (2013.01); *C23C 28/42* (2013.01); *C04B 2111/0025* (2013.01); *C04B 2235/3206* (2013.01); *C04B 2235/3217* (2013.01); *C04B 2235/3227* (2013.01); *C04B 2235/428* (2013.01); *C04B 2235/5436* (2013.01); *C04B 2235/5445* (2013.01); *C04B 2235/6562* (2013.01); *C04B 2235/661* (2013.01); *Y10T 428/24942* (2015.01); *Y10T 428/24975* (2015.01)

(58) Field of Classification Search
USPC ........... 428/212–220, 688–704; 51/307, 309; 407/119
See application file for complete search history.

(56) References Cited

U.S. PATENT DOCUMENTS

| | | |
|---|---|---|
| 2003/0143384 A1 | 7/2003 | Ruppi et al. |
| 2009/0246464 A1* | 10/2009 | Watanabe ............. C04B 35/593 428/141 |
| 2010/0040424 A1* | 2/2010 | Toyoda ................. B23B 27/148 407/119 |

OTHER PUBLICATIONS

English Translation of International Search Report issued in PCT/JP2012/058572 dated Jun. 8, 2012.

* cited by examiner

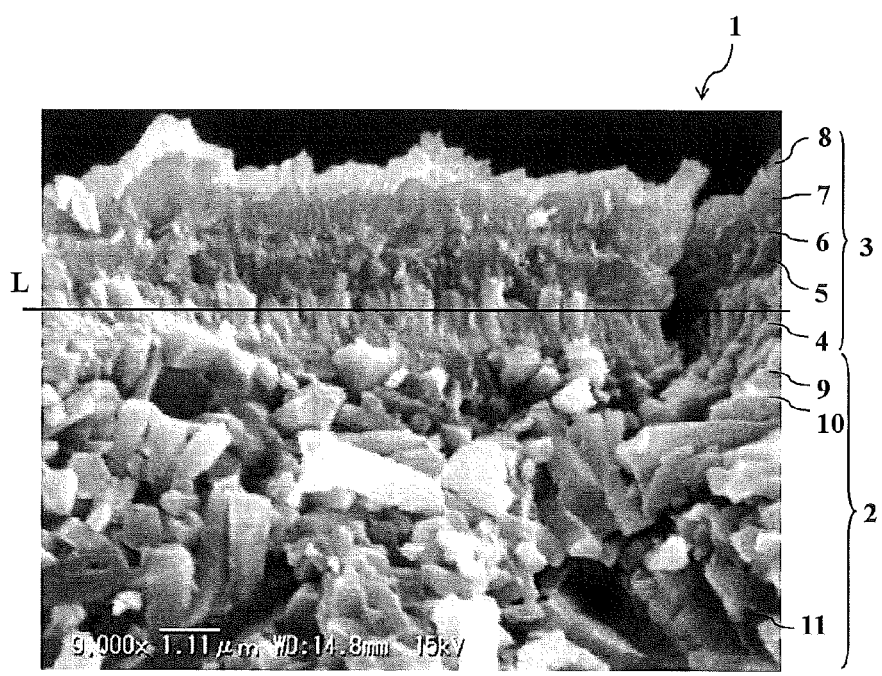

US 9,539,645 B2

CUTTING TOOL

CROSS-REFERENCE TO RELATED APPLICATIONS

This application is a national phase of the International Application PCT/JP2010/058572 filed Mar. 30, 2012 that claims priority from the Japanese patent application JP2011-101134 filed Apr. 28, 2011. The content of these aforementioned documents is herewith incorporated by reference.

TECHNICAL FIELD OF THE INVENTION

The present invention relates to a cutting tool and, in particular, to a cutting tool having a coating layer with good chipping-resistant characteristics.

BACKGROUND OF THE INVENTION

Among cutting tools widely used for cutting of metals, printed circuit boards, and the like, a cutting tool has been known which includes a substrate composed of a cemented carbide, a cermet, a ceramic, or the like and a single or a multiple coating layer provided on a surface of the substrate. As this coating layer, a chemical vapor deposition (CVD) film including a TiC (titanium carbide) layer, a TiN (nitride titanium) layer, a TiCN (titanium carbonitride) layer, an $Al_2O_3$ (aluminum oxide) layer, and the like laminated to each other has been used in many cases.

For example, Patent Literature 1 has disclosed a cutting insert in which a surface of a cemented carbide substrate is coated with a TiCN layer, an $Al_2O_3$ layer, and a TiC layer which are laminated in this order.

In addition, Patent Literature 2 has disclosed the structure in which a surface of a silicon nitride substrate is coated with a hard coating layer, and a first layer of the hard coating layer is a titanium nitride layer of a columnar crystal which contains a granular crystal having a crystalline grain diameter of 1 to 30 nm.

The following is a list of the aforementioned background art
PTL 1: Japanese Unexamined Patent Application Publication No. 2003-213455
PTL 2: Japanese Unexamined Patent Application Publication No. 10-015707

However, even by the structure of the coating layer disclosed in Japanese Unexamined Patent Application Publication No. 2003213455 which is composed by repeatedly laminating a TiCN (TiN) layer and an $Al_2O_3$ layer, or even by the structure as disclosed in Japanese Unexamined Patent Application Publication No. 10-015707 in which the crystalline form of a TiN layer provided right over a substrate composed of a silicon nitride-based sintered body includes both a granular crystal and a columnar crystal at a portion adjacent to the substrate, the adhesion of the coating layer was not sufficient in some cases, and in addition, chipping thereof occurred in some cases due to cracks generated in an $Al_2O_3$ layer in cutting.

The present invention was made to overcome the problems described above, and an object of the present invention is to provide a cutting tool including a coating layer which has a high adhesion and high chipping-resistant characteristics.

SUMMARY OF THE INVENTION

A cutting tool of the present invention comprises: a substrate composed of a silicon nitride-based sintered body; and a coating layer on a surface of the substrate, the coating layer including a first layer composed of TiN having an average crystalline width of 0.1 to 0.4 μm,
a second layer composed of $Al_2O_3$ having an average crystalline width of 0.01 to 1.5 μm,
a third layer composed of TiN having an average crystalline width of 0.01 to 0.1 μm which is smaller than that of the first layer, and
a fourth layer composed of $Al_2O_3$ having an average crystalline width of 0.01 to 1.5 μm, are laminated in this order from the substrate side.

ADVANTAGEOUS EFFECTS OF INVENTION

In the cutting tool according to the present invention, a coating layer is provided on a surface of a substrate composed of a silicon nitride-based sintered body, and in addition, the coating layer includes a first layer composed of TiN layer, a second layer composed of an $Al_2O_3$ layer, a third layer composed of a TiN layer, and a fourth layer composed of an $Al_2O_3$ layer, which are laminated in this order and each layer composed of the crystalline which have the predefined crystalline width. Hence, the coating layer is composed to have a high adhesion and high chipping-resistant characteristics, and as a result, the wear resistance and the chipping-resistant characteristics of the cutting tool are improved.

BRIEF DESCRIPTION OF THE DRAWING

FIG. 1 is a scanning electron microscope (SEM) photo of a cross section including a coating layer of a cutting tool according to one embodiment of the present invention.

DETAILED DESCRIPTION OF THE DRAWING

FIG. 1 is a scanning electron microscope (SEM) photo of a cross section including a coating layer 3 of a cutting tool 1 which is a preferable example of a cutting tool.

As shown in FIG. 1, the cutting tool 1 comprises: a substrate 2 composed of a silicon nitride-based sintered body; and the coating layer 3 provided on a surface of the substrate 2. The coating layer 3 includes a first layer 4 of TiN having an average crystalline width of 0.1 to 0.4 μm, a second layer 5 of $Al_2O_3$ having an average crystalline width of 0.01 to 1.5 μm, a third layer 6 of TiN having an average crystalline width of 0.01 to 0.1 μm which is smaller than that of the first layer 4, and a fourth layer 7 of $Al_2O_3$ having an average crystalline width of 0.01 to 1.5 μm, those layers being laminated in this order from the substrate 2 side. Preferable ranges of the average crystalline widths of the first layer 4, the second layer 5, the third layer 6, and the fourth layer 7 are 0.2 to 0.3 μm, 0.4 to 1.0 μm, 0.01 to 0.05 μm, and 0.3 to 1.0 μm, respectively.

In this embodiment, the average crystalline width indicates the average value of crystalline widths w of crystals of the coating layer 3 in a direction perpendicular to a growth direction of the crystals and is obtained in such a way that in a viewing field of a SEM photo, after a straight line (straight line L shown in FIG. 1) is drawn in a direction perpendicular to the crystal growth direction, that is, in a direction parallel to the surface of the substrate 2, the length of this straight line is divided by the number of grain boundaries intersected by this straight line, and the value obtained by this calculation is defined as the average crystalline width.

Since a silicon nitride crystal of the silicon nitride-based sintered body forming the substrate 2 is composed of a needle crystal, relatively large asperities are composed in the surface of the substrate 2. Hence, the first layer 4 of TiN which is likely to form a columnar crystal and which has a shape unlikely to be pulled out of the surface of the substrate 2 is directly composed thereon. Next, in order to improve the wear resistance, the second layer 5 of $Al_2O_3$ is composed on the surface of the first layer 4. In addition, on the surface of the second layer 5, the third layer 6 of TiN having an average crystalline width of 0.01 to 0.1 µm, which is smaller than the average crystalline width of the first layer 4, is composed. This third layer 6 reduces impact applied to the fourth layer 7 which will be described below and prevents the fourth layer 7 and the second layer 5, each of which is an $Al_2O_3$ layer, from being cracked. Furthermore, in order to improve the wear resistance of the coating layer 3, the fourth layer 7 of $Al_2O_3$ is laminated on the surface of the third layer 6.

By the structure of the coating layer 3 described above, the coating layer 3 has a high adhesion to the substrate 2 and high chipping-resistant characteristics, and hence, the wear resistance and the chipping-resistant characteristics of the cutting tool 1 are improved.

In addition, since the TiN layer and the $Al_2O_3$ layer have different crystalline forms from each other, the adhesion between the individual layers tends to be chipped off. However, according to this embodiment, while the function of each layer is taken into consideration, the interface between the TiN layer and the $Al_2O_3$ layer is decreased as small as possible. In addition to that described above, since the average crystalline width of the crystal forming the first layer 4 is set to be larger than that of the crystal forming the third layer 6, the adhesion to the substrate 2 can be improved. In addition, the third layer 6 can suppress initial chipping and, at the same time, can maintain the adhesion to the second layer 5. Furthermore, the thickness of each layer is controlled in a range so that besides the wear resistance and the chipping-resistant characteristics, the adhesion of each layer can be maintained.

In this embodiment, in order to simultaneously obtain the wear resistance and the chipping-resistant characteristics of the cutting tool 1, the thicknesses of the first layer 4, the second layer 5, the third layer 6, and the fourth layer 7 are preferably set to 0.7 to 1.3 µm, 0.5 to 1.2 µm, 0.1 to 0.3 µm, and 0.5 to 1.2 µm, respectively.

In addition, in order to improve the adhesion of the coating layer 3, the first layer 4 is preferably composed of a columnar crystal having an aspect ratio of 3 to 10. On the other hand, the third layer 6 is preferably composed of a granular crystal since impact applied to the second layer 5 and the fourth layer 7 can be reduced. For discrimination between a columnar crystal and a granular crystal, a crystal having a ratio (aspect ratio) of less than 2 is defined as a granular crystal, and a crystal having a ratio of 2 or more is defined as a columnar crystal, the ratio being a ratio of the longest length of a crystal to the length thereof in a direction perpendicular to the longest length.

In addition, the $Al_2O_3$ layer of the second layer 5 and the $Al_2O_3$ layer of the fourth layer 7 are each composed of a granular crystal. In addition, the average crystalline width of a granular crystal is also measured by the same method and in the same direction as that performed for a columnar crystal.

Furthermore, in order to improve the adhesion and the wear resistance of the coating layer, a ratio (w1/ws) of an average crystalline width w1 of the columnar crystal of the first layer 4 to an average crystalline grain diameter ws of silicon nitride grains forming the substrate 2 is preferably 0.05 to 0.5.

On the other hand, since high wear resistance and high chipping-resistant characteristics can both be obtained, the silicon nitride-based sintered body which forms the substrate 2 preferably contains an oxide of Mg and an oxide of a rare earth element, and in addition, the total content of the oxide of Mg and the oxide of a rare earth element is also preferably 0.5 to 3.5 percent by mass on the basis of MgO and $Re_2O_3$. In addition, the rare earth element (Re) indicates Y or each lanthanoid element, and in particular, La is preferably contained as Re since the chipping-resistant characteristics can be improved.

In addition, in the substrate 2, an interface region 9, an intermediate region 10, and an internal region 11, which will be described later, are present in a direction from the interface (hereinafter referred to as the "surface" in some cases) with the coating layer 3 (first layer 4) toward the inside of the substrate 2. A ratio ($Re_s/Re_i$) of a content ($Re_s$) of Re in the interface region 9 to a Re content ($Re_i$) in the internal region 11 is 0.1 to 0.8. In addition, the ratio ($Re_s/Re_i$) of a content ($Re_m$) of Re in the intermediate region 10 located right under the interface region 9 to the $Re_i$ is 0.05 to 0.3. By the presence of the interface region 9 and the intermediate region 10, the wear resistance can be improved. Furthermore, since chipping of the coating layer 3 can be suppressed, a ratio ($Re_m/Re_s$) is preferably 0.3 to 0.85. In this embodiment, in order to improve the adhesion between the substrate 2 and the coating layer 3, the interface region 9 is preferably located in a range from the surface of the substrate 2 to a depth of 0.5 to 2 µm therefrom, and the intermediate region 10 is preferably located in a range from the end of the interface region 9 to a depth of 2 to 5 µm therefrom (a depth of 2.5 to 7 µm from the surface of the substrate 2). Although the internal region 11 is located deeper than the end of the intermediate region 10, when the composition and the like of the internal region 11 are measured, measurement is performed at a depth of 500 µm or more from the surface of the substrate 2.

Furthermore, in order to improve the adhesion between the substrate 2 and the coating layer 3, a ratio ($Mg_s/Mg_i$) of a content ($Mg_s$) of Mg in the interface region 9 to a Mg content ($Mg_i$) in the internal region 11 of the substrate 2 is preferably 0.1 to 0.3, and at the same time, a ratio ($Mg_m/Mg_i$) of a content ($Mg_m$) of Mg in the intermediate region 10 to $Mg_i$ is preferably 0.1 to 0.3. In addition, in view of the wear resistance and the improvement in adhesion of the coating layer, by diffusion of Si, a ratio ($Si_1/Si_i$) of a Si content ($Si_1$) in the TiN layer of the first layer 4 to a Si content ($Si_i$) in the internal region 11 of the substrate 2 is preferably 0.05 to 0.5. In addition, in order to improve the adhesion of the coating layer 3, a ratio ($Si_s/Si_i$) of a content ($Si_s$) of Si in the interface region 9 to the content ($Si_i$) of Si in the internal region 11 is preferably 0.65 to 0.9. In addition, in view of the wear resistance, it is preferable that the Si content in the intermediate region 10 be not different from that in the internal region 11. Measurement of the content of each element can be performed by a surface analysis or a line analysis of an electron probe microanalysis (EPMA).

In addition, on the surface of the fourth layer 7, a fifth layer 8 is preferably composed from $TiC_xN_{1-x}$ ($0 \leq x \leq 1$), in particular from TiC at x=1 to have an average crystalline width of 0.01 to 0.7 µm, in particular 0.2 to 0.5 µm, and a thickness of 0.1 to 1.0 µm, in particular 0.2 to 0.7 µm.

Furthermore, the average crystalline width of the TiN crystal constituting the first layer 4 is preferably 1.5 to 15 times as large as the average crystalline width of the TiN crystal constituting the third layer 6. By this composition, the adhesion between the substrate 2 and the coating layer 3 can be improved, and at the same time, the chipping-resistant characteristics of the coating layer 3 can also be improved.

Manufacturing Method

One embodiment of a method for manufacturing the cutting tool described above will be described.

As a starting raw material, a silicon nitride ($Si_3N_4$) powder having an average particle diameter of 0.2 to 0.8 μm, a rare earth element (Re) compound (one of lanthanum hydroxide ($La(OH)_2$), yttrium oxide ($Y_2O_3$), ytterbium oxide ($Yb_2O_3$), erbium oxide ($Er_2O_3$), and cerium oxide ($Ce_2O_3$)) powder having an average particle diameter of 1.0 to 1.7 μm, an aluminum oxide ($Al_2O_3$) powder having an average particle diameter of 0.2 to 0.8 μm, and a magnesium hydroxide ($Mg(OH)_2$) powder having an average particle diameter of 1.8 to 4.0 μm were mixed together and were then composed into a predetermined tool shape by a known molding method, such as press molding, cast molding, extrusion molding, cold isostatic press molding, or the like.

After this molded body is degreased and is then set in a firing pot with a mixed powder containing a $Mg(OH)_2$ powder and at least one of a $Si_3N_4$ powder, a Si powder, and a $SiO_2$ powder, the pot is closed with a lid and is then disposed in a carbon-made cylinder, and the pot in the state as described above is placed in a firing furnace. After the inside of the firing furnace is replaced with nitrogen at 1 atm (101 kPa), the temperature is increased to 1,200° C. at a temperature rise rate of 5° C. to 15° C./min and is then further increased to 1,840° C. to 1,880° C. at a rate of 1° C. to 5° C./min, and subsequently, after a nitrogen atmosphere at 1,900° C. to 1,950° C. and 5 to 10 atm (505 to 1,013 kPa) is maintained for 1 to 4 hours, cooling is performed. In addition, as requested, hot isostatic press molding (HIP treatment) is performed at a temperature of 1,500° C. to 1,700° C. and a pressure of 170 to 220 MPa for 2 to 5 hours, so that a silicon nitride-based sintered body is obtained. In addition, as requested, a thickness grinding process (a double head process and an outer circumferential process) is performed on the surface of the sintered body, and a honing process is also performed on a cutting edge portion.

In addition, on the surface of the sintered body, the coating layer is composed by a chemical vapor deposition (CVD) method. As a reaction gas composition, a mixed gas containing 0.1 to 10 percent by volume of a titanium chloride ($TiCl_4$) gas, 10 to 60 percent by volume of a nitrogen ($N_2$) gas, and a hydrogen ($H_2$) gas as the balance is prepared and then introduced into a reaction chamber, and the first layer (TiN layer) is composed at a film formation temperature of 950° C. to 1,100° C. and a pressure of 10 to 90 kPa. In this step, when the film formation temperature and the gas pressure of the first layer are adjusted, the diffusion ratios of the individual elements in the vicinity of the interface between the substrate and the first layer can be controlled.

In this step, as an atmosphere in the chamber when the temperature of a coating apparatus is increased before the first layer (TiN layer) is composed, the temperature is increased in an atmosphere filled with an inert gas, such as Ar or He, at a gas pressure of 80 to 200 kPa, and the first layer (TiN layer) is composed at a film formation temperature of 1,000° C. to 1,100° C. and at a pressure of 50 to 80 kPa. As a result, the concentration distribution of each element, such as Mg, Re, or Si, at the interface between the substrate and the coating layer can be controlled in a predetermined range. In addition, whether the TiN crystal has a columnar shape or a granular shape can be controlled by changing the film formation temperature and the pressure of the mixed gas.

Next, the second layer ($Al_2O_3$ layer) is composed. As a method for forming the $Al_2O_3$ layer, a mixed gas containing 3 to 20 percent by volume of an aluminum chloride ($AlCl_3$) gas, 0.5 to 10 percent by volume of a hydrogen chloride (HCl) gas, 0.01 to 20 percent by volume of a carbon dioxide ($CO_2$) gas, and a hydrogen ($H_2$) gas as the balance is preferably used, and the temperature and the pressure are preferably set to 960° C. to 1,100° C. and 5 to 25 kPa, respectively. According to the conditions described above, although κ-$Al_2O_3$ is basically generated, α-$Al_2O_3$ may also be generated in some cases.

Furthermore, as a reaction gas composition, a mixed gas containing 0.1 to 10 percent by volume of a titanium chloride ($TiCl_4$) gas, 10 to 60 percent by volume of a nitrogen ($N_2$) gas, and a hydrogen ($H_2$) gas as the balance is prepared and then introduced into a reaction chamber, and the third layer (TiN layer) is composed at a film formation temperature of 800° C. to 950° C. and at a pressure of 10 to 30 kPa. In addition, the fourth layer ($Al_2O_3$ layer) is then composed. As a method for forming the $Al_2O_3$ layer, a mixed gas containing 3 to 20 percent by volume of an aluminum chloride ($AlCl_3$) gas, 0.5 to 10 percent by volume of a hydrogen chloride (HCl) gas, 0.01 to 20.0 percent by volume of a carbon dioxide ($CO_2$) gas, and a hydrogen ($H_2$) gas as the balance is preferably used, and the temperature and the pressure are preferably set to 950° C. to 1,100° C. and 5 to 25 kPa, respectively. Even by the conditions described above, although κ-$Al_2O_3$ is generated, α-$Al_2O_3$ may also be generated in some cases.

Subsequently, for example, as a reaction gas composition, a mixed gas containing 0.1 to 10 percent by volume of a titanium chloride ($TiCl_4$) gas, 0.01 to 10 percent by volume of a carbon dioxide ($CO_2$) gas, and a hydrogen ($H_2$) gas as the balance is prepared and then introduced into a reaction chamber, and on the uppermost surface of the $Al_2O_3$ layer, the fifth layer of TiC is composed at a film formation temperature of 780° C. to 1,100° C. and a pressure of 5 to 25 kPa. As a result, a cutting tool in which the coating layer is composed on the surface of the silicon nitride-based sintered body is obtained.

In addition, as requested, at least the cutting edge portion of the surface of the coating layer 3 thus composed is treated by a polishing process. By this polishing process, the cutting edge portion is smoothly processed, and a tool which can suppress welding of a work material and which has good chipping-resistant characteristics is obtained.

EXAMPLES

Example 1

As a starting raw material, after 1.76 percent by mass of a lanthanum hydroxide ($La(OH)_2$) powder having an average particle diameter of 1.2 μm which functioned as a Re element compound, 0.4 percent by mass of an aluminum oxide ($Al_2O_3$) powder having an average particle diameter of 0.7 μm, 0.72 percent by mass of a magnesium hydroxide ($Mg(OH)_2$) having an average particle diameter of 2.5 μm, and a silicon nitride ($Si_3N_4$) powder as the balance having an average particle diameter of 0.3 μm were mixed together, a binder and a solvent were added to the mixture thus prepared, and pulverization and mixing were then performed by a mill for 72 hours. Subsequently, the solvent was removed by drying to form a granulated powder, and this granulated powder is formed into a cutting tool shape of SNGN120412 by press molding at a pressure of 98 MPa.

After this molded body was degreased and then set in a firing pot with a mixed powder containing a $Si_3N_4$ powder, a Si powder, and a $Mg(OH)_2$ powder and functioning as a spreading powder to be filled in a space around the molded body, the pot was closed with a lid and was then disposed in a carbon-made cylinder, and the pot in the state as described above was placed in a firing furnace. After the inside of the firing furnace was replaced with nitrogen at a pressure of 101 kPa (1 atm), the temperature was increased to 1,200° C. at a temperature rise rate of 10° C./min and then further increased to 1,860° C. at a rate of 2° C./min. Subsequently, after a nitrogen atmosphere at 1,920° C. and 909 kPa (9 atm) was maintained for 2 hours, cooling was performed. In addition, hot isostatic press molding (HIP treatment) was performed at a temperature of 1,600° C. and a pressure of 196 MPa for 2 hours, and 0.3 mm-thickness grinding process (a double head process and an outer circumferential process) was further performed on the surface of this sintered body, so that a silicon nitride-based sintered body was obtained. The structure of the silicon nitride-based sintered body was observed using the cross-section thereof by a scanning electron microscope (SEM) at a magnification of 5,000 times, and when the average grain diameter of the silicon nitride grains was measured by an image analysis, the average grain diameter was 0.6 μm.

Next, on the surface of the sintered body, a coating layer was formed by a chemical vapor deposition (CVD) method. As film formation conditions, the conditions shown in Table 1 were used. In addition, as the coating conditions of a coating layer of Sample No. 1, a TiN layer of a first layer was formed using a mixed gas composition of TiN2 shown in Table 1 at a film formation temperature of 1,010° C. and a gas pressure of 30 kPa; an $Al_2O_3$ layer of a second layer was formed using a mixed gas composition of $Al_2O_3$1 shown in Table 1 at a film formation temperature of 1,005° C. and a gas pressure of 9 kPa; a TiN layer of a third layer was formed using a mixed gas composition of TiN1 shown in Table 1 at a film formation temperature of 880° C. and a gas pressure of 16 kPa; an $Al_2O_3$ layer of a fourth layer was formed using a mixed gas composition of $Al_2O_3$2 shown in Table 1 at a film formation temperature of 1,005° C. and a gas pressure of 9 kPa; and a TiC layer of a fifth layer was formed using a mixed gas composition of TiC shown in Table 1 at a film formation temperature of 1,010° C. and a gas pressure of 15 kPa. In Sample Nos. 2 to 17, the TiN layer of the first layer was formed by TiN2 shown in Table 1, the $Al_2O_3$ layer of the second layer was formed by $Al_2O_3$1 shown in Table 1, the TiN layer of the third layer was formed by TiN1 shown in Table 1, the $Al_2O_3$ layer of the fourth layer was formed by $Al_2O_3$2 shown in Table 1, and the fifth layer was formed by one of TiC, TiCN, and TiN2 shown in Table 1. Subsequently, the surface of the coating layer 3 was treated by a brushing process for 30 seconds from a rake face side, so that the cutting tools of Sample Nos. 1 to 17 were formed.

TABLE 1

| Conditions | Mixed gas composition (vol %) | Film formation temperature (° C.) | Pressure (kPa) |
|---|---|---|---|
| TiN1 | $TiCl_4$: 2.0, $N_2$: 33, $H_2$: balance | 800 to 950 | 16 |
| TiN2 | $TiCl_4$: 2.0, $N_2$: 30, $H_2$: balance | 950 to 1100 | 30 |
| TiC | $TiCl_4$: 3.0, $CH_4$: 7, $H_2$: balance | 1000 to 1100 | 15 |
| TiCN | $TiCl_4$: 2.5, $N_2$: 23, $CH_3CN$: 0.4, $H_2$: balance | 865 | 9 |
| $Al_2O_3$1 | $AlCl_3$: 1.5, HCl: 2, $CO_2$: 4, $H_2$: balance | 960 to 1100 | 9 |
| $Al_2O_3$2 | $AlCl_3$: 1.5, HCl: 2, $CO_2$: 4, $H_2S$: 0.3, $H_2$: balance | 960 to 1100 | 9 |

Subsequently, the thickness of each layer and the crystal thereof were observed using a scanning electron microscope (SEM), and the average crystalline width and the aspect ratio were calculated. In addition, the contents of Mg and a rare earth element of the substrate were measured using an EPMA (electron probe microanalyzer), and the total content was calculated on the basis of MgO and $Re_2O_3$.

Furthermore, an intermittent cutting test was performed using this cutting tool under the following conditions, and the chipping-resistant characteristics were evaluated.
Work material: FCD-450 Sleeve material
Cutting speed: 500 m/min
Feed: 0.5 mm/rev
Cutting depth: 2.0 mm
Cutting condition: Wet cutting
Evaluation method: After cutting was performed for 10 minutes, the flank wear amount and the chipping state of a cutting edge were observed by a digital scope. The results are shown in Table 2.

TABLE 2

| Sample No. | Coating layer[1] | | | | | Total oxide content (mass %) | $w_1/w_s$[2] | $w_1/w_3$[3] | Flank wear amount (mm) | Cutting edge state |
| | First layer | Second layer | Third layer | Fourth layer | Fifth layer | | | | | |
|---|---|---|---|---|---|---|---|---|---|---|
| 1 | TiN (columnar 1.0) [0.2 7.0] | $Al_2O_3$(κ) (1.0) [0.5] | TiN (granular 0.05) [0.05 1.0] | $Al_2O_3$(κ) (0.5) [0.4] | TiC (powder 0.4) [0.3] | 2.5 | 0.3 | 4.0 | 0.15 | OK |
| 2 | TiN (columnar 0.4) [0.4 2.0] | $Al_2O_3$(κ) (1.0) [0.5] | TiN (columnar 0.1) [0.05 2.0] | $Al_2O_3$(κ) (1.0) [0.4] | TiC (granular 0.4) [0.3] | 2.7 | 0.5 | 8.0 | 0.22 | OK |
| 3 | TiN (columnar 1.0) [0.1 10.0] | $Al_2O_3$(κ) (1.0) [0.5] | TiN (granular 0.1) [0.01 1.5] | $Al_2O_3$(κ) (1.0) [0.4] | TiC (granular 0.4) [0.3] | 2.7 | 0.2 | 10.0 | 0.23 | OK |
| 4 | TiN (columnar 1.0) [0.2 5.0] | $Al_2O_3$(κ) (1.0) [0.5] | TiN (granular 0.1) [0.031 1.5] | $Al_2O_3$(κ) (1.0) [0.4] | — | 2.0 | 0.3 | 6.7 | 0.2 | OK |
| 5 | TiN (columnar 1.0) [0.1 5.0] | $Al_2O_3$(κ) (1.0) [0.5] | TiN (granular 0.1) [0.01 1.5] | $Al_2O_3$(κ) (1.0) [0.4] | TiN (granular 0.5) [0.2] | 2.1 | 0.3 | 10.0 | 0.25 | OK |
| 6 | TiN (columnar 1.0) [0.1 10.0] | $Al_2O_3$(κ) (1.0) [0.5] | TiN (granular 0.1) [0.05 1.0] | $Al_2O_3$(κ) (1.0) [0.4] | TiCN (columnar 0.5) [0.4] | 2.5 | 0.2 | 2.0 | 0.27 | OK |
| 7 | TiN (columnar 1.0) [0.15 8.0] | $Al_2O_3$(α) (1.0) [0.9] | TiN (columnar 0.1) [0.1 2.0] | $Al_2O_3$(α) (1.0) [0.8] | TiC (granular 0.4) [0.3] | 1.7 | 0.3 | 1.5 | 0.27 | OK |
| 8 | TiN (columnar 1.2) [0.2 12.0] | $Al_2O_3$(α) (1.0) [0.9] | TiN (granular 0.1) [0.01 1.0] | $Al_2O_3$(α) (1.0) [0.8] | TiC (granular 0.4) [0.3] | 1.5 | 0.2 | 20.0 | 0.28 | OK |

TABLE 2-continued

| Sample No. | First layer | Second layer | Third layer | Fourth layer | Fifth layer | Total oxide content (mass %) | $w_1/w_s^{2)}$ | $w_1/w_3^{3)}$ | Flank wear amount (mm) | Cutting edge state |
|---|---|---|---|---|---|---|---|---|---|---|
| 9 | TiN (columnar 0.8) [0.12 8.0] | $Al_2O_3(\alpha)$ (1.0) [0.9] | TiN (columnar 0.3) [0.1 3.0] | $Al_2O_3(\alpha)$ (1.0) [0.8] | TiC (granular 0.4) [0.3] | 2.0 | 0.3 | 1.2 | 0.28 | OK |
| 10 | TiN (columnar 1.0) [0.13 10.0] | $Al_2O_3(\kappa)$ (4.0) [0.9] | TiN (granular 0.1) [0.1 1.0] | $Al_2O_3(\kappa)$ (4.0) [1.0] | TiC (granular 0.4) [0.4] | 3.0 | 0.2 | 1.3 | 0.29 | OK |
| 11 | TiN (columnar 1.0) [0.2 5.0] | $Al_2O_3(\kappa)$ (4.0) [0.9] | TiN (granular 0.1) [0.01 1.7] | $Al_2O_3(\kappa)$ (4.0) [1.0] | TiC (granular 0.5) [0.4] | 0.4 | 0.3 | 20.0 | 0.3 | OK |
| 12 | TiN (granular 0.1) [0.1 5.0] | $Al_2O_3(\kappa)$ (1.0) [0.9] | TiN (columnar 0.5) [0.01 2.0] | $Al_2O_3(\kappa)$ (1.0) [1.0] | TiC (granular 0.5) [0.5] | 3.1 | 0.2 | 10.0 | 0.29 | OK |
| 13 | TiN (granular 0.1) [0.2 2.0] | $Al_2O_3(\kappa)$ (0.3) [0.5] | TiN (columnar 0.5) [0.04 2.0] | $Al_2O_3(\kappa)$ (0.4) [0.4] | TiC (granular 0.5) [0.3] | 2.0 | 0.3 | 5.0 | 0.29 | OK |
| 14 | TiN (columnar 1.0) [0.15 7.0] | TiCN (0.5) [0.4] | $Al_2O_3(\alpha)$ (1.0) [0.8] | TiCN (0.5) [0.4] | TiN (granular 1.0) [0.2] | 2.5 | 0.3 | — | 0.5 | chiped off |
| 15 | TiN (granular 0.1) [0.1 0.9] | $Al_2O_3(\kappa)$ (1.0) [0.5] | TiN (granular 0.1) [0.1 0.9] | $Al_2O_3(\kappa)$ (1.0) [0.5] | TiC (granular 0.4) [0.3] | 2.1 | 0.2 | 1.0 | 0.48 | peeling |
| 16 | TiN (columnar 1.0) [0.2 5.0] | $Al_2O_3(\kappa)$ (1.1) [2.0] | TiN (granular 0.1) [0.01 1.0] | $Al_2O_3(\kappa)$ (1.2) [1.0] | TiC (granular 0.4) [0.3] | 2.2 | 0.3 | 20.0 | 0.41 | chipping |
| 17 | TiN (granular 1.0) [0.2 1.0] | $Al_2O_3(\kappa)$ (1.0) [0.9] | TiN (columnar 0.5) [0.5 3.0] | $Al_2O_3(\kappa)$ (1.0) [1.0] | TiC (granular 0.4) [0.3] | 2.2 | 0.3 | 0.4 | 0.5 | peeling |

[1)]coating layer (crystalline structure, layer thickness (μm)), [average crystalline width (μm), aspect ratio]
$Al_2O_3$ layer (layer thickness (μm)), [average crystalline width (μm)] ( ) indicates crystalline type TiC layer (crystalline mode, layer thickness (μm)), [average crystalline width (μm)]
[2)]$w_1/w_s$: average crystalline width of TiN in first layer/average grain diameter of $Si_3N_4$ crystal in substrate
[3)]$w_1/w_3$: average crystalline width in first layer/average crystalline width in third layer As apparent from Tables 1 and 2, in Sample No. 16 in which the average crystalline width of the $Al_2O_3$ layer of the second layer was larger than 1.5 μm, chipping was generated in the coating layer. In addition, in Sample No. 17 in which the average crystalline width of the TiN layer of the third layer was larger than 0.1 μm, peeling of the coating layer occurred. Furthermore, in Sample No. 15 in which the composition of the TiN layer of the first layer was the same as that of the third layer, peeling of the coating layer also occurred. In addition, in Sample No. 14 in which the layer structure of the coating layer was different from that of the other samples, damage was done to the cutting edge.

On the other hand, in Sample Nos. 1 to 13 in which the structure of the coating layer was composed according to the present invention, chipping and peeling of the coating layer were not generated, and the flank wear amount was also small.

Except that in the sample of Sample No. 1 of Example 1, the film formation conditions of the TiN layer of the first layer were changed as shown in Table 3, the substrate and the individual layers other than the first layer were composed under the same conditions as those in Example 1, so that the coating layer was composed on the surface of the substrate composed of a silicon nitride-based sintered body.

An EPMA analysis at an acceleration voltage of 15 kV and an irradiation current of $2 \times 10^{-7}$ A was performed in the vicinity of the interface between the substrate and the coating layer of the sample thus obtained, and the distribution states of La, Mg, and Si were confirmed. The distribution states in the interface region, the intermediate region, and the internal region of the substrate are shown in Tables 3 to 5. In the tables, based on the content in the substrate or that in each coating layer, the ratio is described. In addition, the other properties were also evaluated in a manner similar to that of Example 1.

TABLE 3

| | Pretreatment conditions | | Film formation conditions of first layer | | | La distribution state | | | | |
|---|---|---|---|---|---|---|---|---|---|---|
| Sample No. | Type of gas | Pressure (kPa) | Film formation temperature (°C.) | Pressure (kPa) | First layer[1)] | Second layer | First layer | Interface region $La_s/La_i$ | Intermediate region $La_m/La_i$ | $La_m/La_s$ |
| 18 | Ar | 101 | 1020 | 80 | TiN (columnar 1.0) [0.25 6.0] | <0.05 | <0.05 | 0.22 | 0.08 | 0.36 |
| 19 | He | 101 | 1010 | 50 | TiN (columnar 1.0) [0.22 5.5] | <0.05 | <0.05 | 0.30 | 0.25 | 0.83 |
| 20 | $N_2$ | 101 | 1000 | 70 | TiN (columnar 1.0) [0.18 7.0] | <0.05 | <0.05 | 0.12 | 0.22 | 1.83 |

TABLE 3-continued

| | Pretreatment conditions | | Film formation conditions of first layer | | | La distribution state | | | | |
|---|---|---|---|---|---|---|---|---|---|---|
| Sample No. | Type of gas | Pressure (kPa) | Film formation temperature (° C.) | Pressure (kPa) | First layer[1] | Second layer | First layer | Interface region $La_s/La_i$ | Intermediate region $La_m/La_i$ | $La_m/La_s$ |
| 21 | $N_2$ | 50 | 950 | 100 | TiN (columnar 1.0) [0.17 6.3] | <0.05 | <0.05 | <0.05 | <0.05 | — |
| 22 | Ar | 80 | 1020 | 70 | TiN (columnar 1.0) [0.23 6.5] | <0.05 | 0.15 | 0.30 | 0.11 | 0.37 |

[1]first layer ((crystalline mode), layer thickness (μm)), [average crystalline width (μm), (aspect ratio)]

TABLE 4

| | Mg distribution state | | | | Si distribution state | | | |
|---|---|---|---|---|---|---|---|---|
| Sample No. | Second layer | First layer | Interface region $Mg_s/Mg_i$ | Intermediate region $Mg_m/Mg_i$ | Second layer | First layer | Interface region $Si_s/Si_i$ | Intermediate region |
| 18 | <0.05 | <0.05 | 0.25 | 0.18 | <0.05 | 0.15 | 0.75 | None |
| 19 | <0.05 | <0.05 | 0.25 | 0.22 | <0.05 | 0.20 | 0.82 | None |
| 20 | <0.05 | <0.05 | 0.18 | 0.20 | <0.05 | 0.07 | 0.60 | None |
| 21 | <0.05 | <0.05 | 0.10 | 0.08 | <0.05 | <0.05 | 0.45 | None |
| 22 | <0.05 | <0.05 | 0.22 | 0.22 | <0.05 | 0.11 | 0.73 | None |

TABLE 5

| Sample No. | Oxide amount (mass %) | $w_1/w_s$ [2] | $w_1/w_3$ [3] | Flank wear amount (final process) (mm) | Cutting edge state |
|---|---|---|---|---|---|
| 18 | 2.5 | 0.87 | 4.00 | 0.12 | OK |
| 19 | 2.5 | 0.37 | 3.52 | 0.21 | OK |
| 20 | 2.5 | 0.30 | 2.88 | 0.24 | OK |
| 21 | 2.5 | 0.28 | 2.72 | 0.18 | OK |
| 22 | 2.5 | 0.38 | 3.68 | 0.28 | OK |

[2]$w_1/w_s$: average crystalline width of TiN in first layer/average grain diameter of $Si_3N_4$ crystal in substrate
[3]$w_1/w_3$: average crystalline width in first layer/average crystalline width in third layer From Tables 3 to 5, it was confirmed that in Sample Nos. 18 and 19 in which the ratio ($Re_s/Re_i$) of the content ($Re_s$) of Re in the interface region between the substrate 2 and the coating layer 3 to the Re content ($Re_i$) in the internal region located at a depth of 500 μm or more from the surface of the substrate 2 was 0.05 to 0.30, and in which the intermediate region having a small content ($Re_m$) of Re was present in the vicinity of the surface of the substrate 2 which was right under the interface, good cutting characteristics could be obtained as compared to that of the other samples of Sample Nos. 20 to 22.

REFERENCE SIGNS LIST

1 cutting tool
2 substrate
3 coating layer
4 first layer (TiN layer)
5 second layer ($Al_2O_3$ layer)
6 third layer (TiN layer)
7 fourth layer ($Al_2O_3$ layer)
8 fifth layer ($TiC_xN_{1-x}$ layer)
9 interface region
10 intermediate region
11 internal region

What is claimed is:

1. A cutting tool comprising:
   a substrate composed of a silicon nitride-based sintered body; and
   a coating layer, the coating layer comprising:
      a first layer directly disposed on the surface of the substrate, composed of TiN having a first average crystalline width of 0.1 to 0.4 μm;
      a second layer on the first layer, composed of $Al_2O_3$ having a second average crystalline width of 0.01 to 1.5 μm;
      a third layer on the second layer, composed of TiN having a third average crystalline width of 0.01 to 0.1 μm which is smaller than that of the first layer; and
      a fourth layer on the third layer, composed of $Al_2O_3$ having a fourth average crystalline width of 0.01 to 1.5 μm.

2. The cutting tool according to claim 1, wherein
   the first layer has a thickness of 0.7 to 1.3 μm,
   the second layer has a thickness of 0.5 to 1.2 μm,
   the third layer has a thickness of 0.1 to 0.3 μm, and
   the fourth layer has a thickness of 0.5 to 1.2 μm.

3. The cutting tool according to claim 1, wherein
   the first layer is composed of a columnar crystal having an aspect ratio of 3 to 10; and
   the third layer is composed of a granular crystal having an aspect ratio of 2 or less.

4. The cutting tool according to claim 3, wherein
   a ratio (w1/ws) of the first average crystalline width w1 to an average crystalline grain diameter ws of silicon nitride grains in the substrate is 0.05 to 0.5.

5. The cutting tool according to claim 1, wherein the silicon nitride-based sintered body contains an oxide of Mg and an oxide of a rare earth element (Re), and the total content of the oxides of Mg and the rare earth element at the surface of the substrate is 0.5 to 3.5 percent by mass on the basis of MgO and $Re_2O_3$.

6. The cutting tool according to claim 5, wherein the substrate comprises:
an interface region, and
an intermediate region, and an internal region from an interface between the substrate and the coating layer toward the inside of the substrate, and
a ratio ($Re_s/Re_j$) of a content ($Re_s$) of Re in the interface region to an Re content ($Re_j$) in the internal region is 0.1 to 0.8, and a ratio ($Re_m/Re_j$) of a content ($Re_m$) of Re in the intermediate region to the Re is 0.05 to 0.3.

7. The cutting tool according to claim 1, wherein the coating layer further comprises a fifth layer on the fourth layer, the fifth layer being composed of $TiC_xN_{1-x}$ ($0 \leq x \leq 1$) having an average crystalline width of 0.01 to 0.3 μm and a thickness of 0.1 to 0.5 μm.

8. The cutting tool according to claim 1, wherein
the first average crystalline width is 1.5 to 15 times as large as the third average crystalline width.

* * * * *